(12) United States Patent
Sughrue et al.

(10) Patent No.: US 11,768,265 B2
(45) Date of Patent: Sep. 26, 2023

(54) HARMONIZING DIFFUSION TENSOR IMAGES USING MACHINE LEARNING

(71) Applicant: Omniscient Neurotechnology Pty Limited, Sydney (AU)

(72) Inventors: Michael Edward Sughrue, Sydney (AU); Stephane Philippe Doyen, Glebe (AU); Peter James Nicholas, South Hurstville (AU); Hugh Monro Taylor, Point Piper (AU)

(73) Assignee: Omniscient Neurotechnology Pty Limited, Sydney (AU)

( * ) Notice: Subject to any disclaimer, the term of this patent is extended or adjusted under 35 U.S.C. 154(b) by 0 days.

(21) Appl. No.: 17/746,839

(22) Filed: May 17, 2022

(65) Prior Publication Data

US 2023/0108272 A1    Apr. 6, 2023

Related U.S. Application Data

(63) Continuation of application No. 17/494,800, filed on Oct. 5, 2021, now Pat. No. 11,360,177.

(51) Int. Cl.
*G01V 3/00*     (2006.01)
*G01R 33/563*   (2006.01)
(Continued)

(52) U.S. Cl.
CPC ... *G01R 33/56341* (2013.01); *G01R 33/5608* (2013.01); *G06F 18/214* (2023.01); *G06N 3/08* (2013.01)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS

| 11,360,177 B1 | 6/2022 | Sughrue et al. |
| 2011/0199084 A1 | 8/2011 | Hasan |
| 2016/0225146 A1 | 8/2016 | Frank et al. |

OTHER PUBLICATIONS

Github.com [online], "pnlbwh/dMRIharmonization," published on or before Mar. 5, 2019, retrieved on Oct. 22, 2021, retrieved from URL<https://github.com/pnlbwh/dMRIharmonization>, 24 pages.

(Continued)

*Primary Examiner* — Walter L Lindsay, Jr.
*Assistant Examiner* — Frederick Wenderoth
(74) *Attorney, Agent, or Firm* — Fish & Richardson P.C.

(57) ABSTRACT

Methods, systems, and apparatus, including computer programs encoded on computer storage media, for harmonizing diffusion tensor images. One of the methods includes obtaining a diffusion tensor image; determining a set of RISH features for the diffusion tensor image; processing a model input generated from the set of RISH features using a machine learning model to generate a model output identifying an image transformation from a set of image transformations, wherein each image transformation in the set of image transformations corresponds to a respective different first MRI scanner and represents a transformation that, when applied to first diffusion tensor images captured by the first MRI scanner, harmonizes the first diffusion tensor images with second diffusion tensor images captured by a reference MRI scanner; and processing the diffusion tensor image using the identified image transformation to generate a harmonized diffusion tensor image.

20 Claims, 8 Drawing Sheets

(51) Int. Cl.
*G06N 3/08* (2023.01)
*G01R 33/56* (2006.01)
*G06F 18/214* (2023.01)

(58) Field of Classification Search
USPC .......................................................... 324/309
See application file for complete search history.

(56) References Cited

OTHER PUBLICATIONS

Karayumak et al., "Retrospective harmonization of multi-site diffusion MRI data acquired with different acquisition parameters," Neuroimage, Jan. 1, 2019, 42 pages.
Mirzaalian et al., "Multi-site harmonization of diffusion MRI data in a registration framework," Springer Science+Business Media New York, Feb. 7, 2017, 12 pages.
International Search Report and Written Opinion in International Appln. No. PCT/AU2022/051094, dated Dec. 12, 2022, 9 pages.
Mirzaalian et al., "Harmonizing Diffusion MRI Data Across Multiple Sites and Scanners," Springer, Cham, Nov. 18, 2015, vol. 9349, retrieved on Nov. 21, 2022, retrieved from URL<https://doi.org/10.1007/978-3-319-24553-9_2>, 7 pages.
Ning et al., "Cross-scanner and cross-protocol multi-shell diffusion MRI data harmonization: Algorithms and results," NeuroImage, Jul. 13, 2020, vol. 221, retrieved on Nov. 21, 2022, retrieved from URL<https://doi.org/10.1016/j.neuroimage.2020.117128>, 16 pages.
Pinto et al., "Harmonization of Brain Diffusion MRI: Concepts and Methods," Frontiers in Neuroscience, May 6, 2020, vol. 14, retrieved on Nov. 21, 2022, retrieved from URL<https://doi.org/10.3389/fnins.2020.00396>, 17 pages.

BRAIN TRACTS MEASURED USING DIFFUSSION TENSOR IMAGING 300

HARMONIZING DIFFUSION TENSOR IMAGES USING MACHINE LEARNING

CROSS-REFERENCE TO RELATED APPLICATION

This application is a continuation of and claims priority to U.S. patent application Ser. No. 17/494,800, field Oct. 5, 2021, the entire contents of which are incorporated herein by reference.

BACKGROUND

This specification relates to diffusion tensor imaging (DTI). Diffusion tensor imaging uses magnetic resonance images to measure diffusion of water in a subject brain. One can use the measured diffusion to generate tractography data, which can include images of neural tracts and corresponding white matter fibers of the subject brain.

SUMMARY

This specification relates to harmonizing diffusion tensor images generated by respective different magnetic resonance imaging (MRI) scanners.

Generally, there is a variance between the diffusion tensor images generated by different MRI scanners, even between diffusion tensor images generated by MRI scanners manufactured by the same manufacturer in the same factory at the same time. That is, even if a set of MRI scanners were to measure the brain of the same subject under the same conditions, the diffusion tensor images generated by the MRI scanners would be different.

For example, different MRI scanners can generate diffusion tensor images that identify a different numbers of tracts in the brain of the subject. As another example, different MRI scanners can generate diffusion tensor images that have different fractional anisotropy (FA) values, indicating a different measure of the strength of the tracts in the brain of the subject.

These differences can pose a significant problem for physicians and researchers who must analyze diffusion tensor images generated by different MRI scanners. For example, when attempting to determine the effects of a treatment on the brain of a subject, a physician may need to compare a diffusion tensor image of the brain of the subject generated before the treatment with a diffusion tensor image of the brain of the subject generated after the treatment; in this example, it is important that any differences between the two diffusion tensor images primarily reflect a change in the brain of the subject, and not a difference between the respective MRI scanners that generated the images. As another example, a researcher conducting a clinical study using diffusion tensor images generated by different MRI scanners may require that the diffusion tensor images primarily reflect the range of differences between the brains of subjects in the study and not the range of differences between the different MRI scanners.

Therefore, before analyzing a set of one or more diffusion tensor images, it can often be useful or necessary to "harmonize" the diffusion tensor images with each other. That is, a system can modify each diffusion tensor image in the set so that the diffusion tensor images resemble the images generated by a single reference MRI scanner.

Some existing techniques for harmonizing diffusion tensor images leverage rotation-invariant spherical harmonic (RISH) features of the diffusion tensor images. In particular, for each MRI scanner that generates diffusion tensor images to be harmonized, a system can determine a set of RISH features corresponding to the MRI scanner, e.g., the mean RISH features of a set of multiple diffusion tensor images generated by the MRI scanner. The system can determine a difference between (i) the RISH features corresponding to the MRI scanner and (ii) a set of RISH features corresponding to the reference MRI scanner, and generate an image transformation using the determined difference. Then, for each diffusion tensor image generated by the MRI scanner, the system can generate a set of RISH features of the diffusion tensor image, and apply the image transformation to the RISH features of the diffusion tensor image to generate a harmonized diffusion tensor image that appears to be drawn from the same distribution as the images generated by the reference MRI scanner.

However, such techniques often do not scale well for large data sets that include images generated by many different MRI scanners, because the techniques require a different image transformation to be learned for each MRI scanner in order to harmonize the diffusion tensor image generated by that MRI scanner only. That is, for each new MRI scanner, the system must obtain a corpus of diffusion tensor images generated by the new MRI scanner (e.g., 10, 50, or 100 diffusion tensor images), compute a set of RISH features for each generated diffusion tensor image, and then generate the image transformation from the sets of RISH features. Repeating this process for each of hundreds or thousands of MRI scanners can have a prohibitive time, computational, and/or monetary cost. For example, performing this process for even a single MRI scanner can take multiple days or weeks.

This specification describes techniques for using machine learning to determine, for a particular diffusion tensor image, a corresponding image transformation that can be applied to the diffusion tensor image to harmonize the image with a set of other diffusion tensor images, in a significantly more efficient manner than the techniques described above. For example, in some implementations, described in this specification, a system processes the diffusion tensor image using a trained machine learning model that is configured to generate a model output identifying a particular image transformation, from a library of image transformations, that can be applied to the diffusion tensor image. This process can take less than an hour, less than a minute, or less than a second, with minimal computational, labor, or financial costs.

In some implementations, the machine learning model can be configured such that it is not necessary to know which MRI scanner generated a particular diffusion tensor image; even without this information, the machine learning model can identify an appropriate image transformation to apply to the particular diffusion tensor image.

In some implementations, after processing multiple diffusion tensor images generated by the same MRI scanner using the machine learning model, the system can determine to associate the MRI scanner with the same image transformation that was applied to the multiple diffusion tensor images. That is, the system can automatically learn, for each MRI scanner, a corresponding image transformation while obviating the need to perform the existing techniques described above.

Particular embodiments of the subject matter described in this specification can be implemented so as to realize one or more of the following advantages. As described above, using techniques described in this specification, a system can efficiently harmonize a set of diffusion tensor images. Using techniques described in this specification, a training system can train a machine learning model to identify patterns in diffusion tensor images and leverage the patterns to automatically determine the optimal image transformation to be applied to each diffusion tensor image to harmonize the image with a reference MRI scanner. That is, the techniques described in this specification do not require domain experts to select or tune the image transformations for each diffusion tensor image.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

This specification describes a system that uses machine learning to harmonize diffusion tensor images.

Figure 1A:
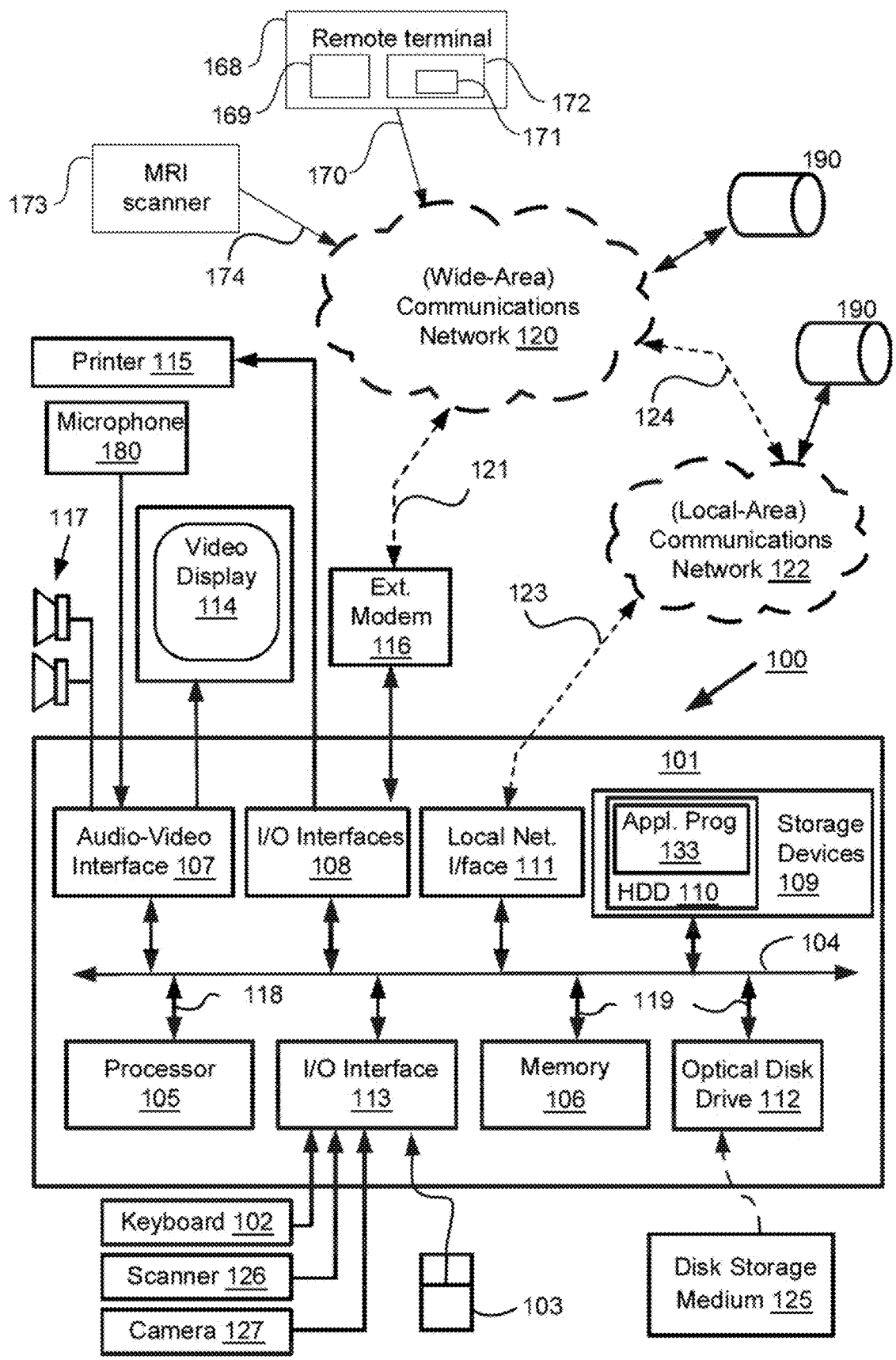
FIG. 1A and FIG. 1B are block diagrams that illustrate an example computer system for use in processing medical images.
Figure 1B:
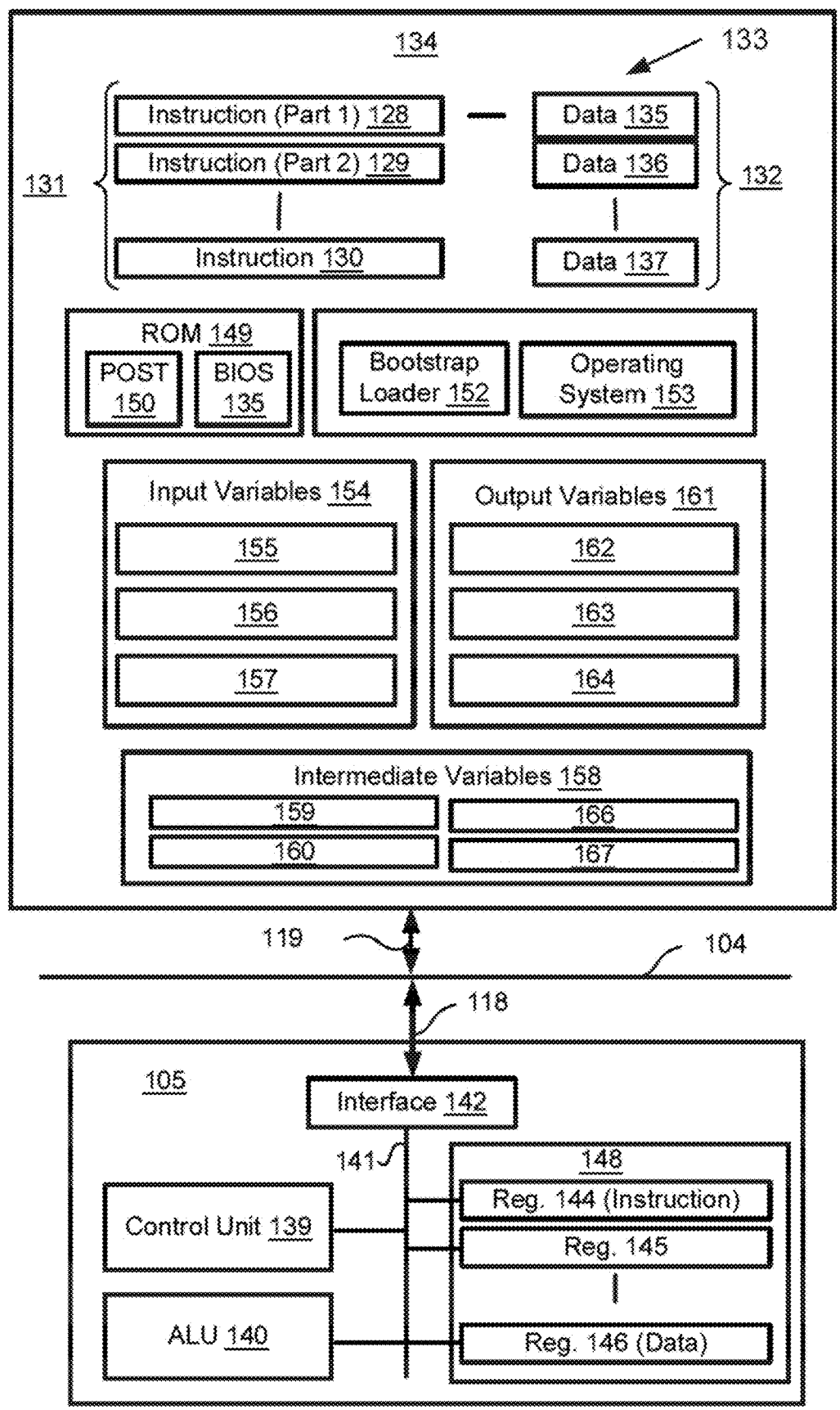

FIGS. 1A and 1B are block diagrams of a general-purpose computer system 100 upon which one can practice arrangements described in this specification. The following description is directed primarily to a computer server module 101. However, the description applies equally or equivalently to one or more remote terminals 168.

As seen in FIG. 1A, the computer system 100 includes: the server computer module 101; input devices such as a keyboard 102, a pointer device 103 (e.g., a mouse), a scanner 126, a camera 127, and a microphone 180; and output devices including a printer 115, a display device 114 and loudspeakers 117. An external Modulator-Demodulator (Modem) transceiver device 116 may be used by the computer server module 101 for communicating to and from the remote terminal 168 over a computer communications network 120 via a connection 121 and a connection 170. The aforementioned communication can take place between the remote terminal 168 and "the cloud" which in the present description comprises at least the one server module 101. The remote terminal 168 typically has input and output devices (not shown) which are similar to those described in regard to the server module 101. The communications network 120 may be a wide-area network (WAN), such as the Internet, a cellular telecommunications network, or a private WAN. Where the connection 121 is a telephone line, the modem 116 may be a traditional "dial-up" modem. Alternatively, where the connection 121 is a high capacity (e.g., cable) connection, the modem 116 may be a broadband modem. A wireless modem may also be used for wireless connection to the communications network 120.

The computer server module 101 typically includes at least one processor unit 105, and a memory unit 106. For example, the memory unit 106 may have semiconductor random access memory (RAM) and semiconductor read only memory (ROM). The remote terminal 168 typically includes as least one processor 169 and a memory 172. The computer server module 101 also includes a number of input/output (I/O) interfaces including: an audio-video interface 107 that couples to the video display 114, loudspeakers 117 and microphone 180; an I/O interface 113 that couples to the keyboard 102, mouse 103, scanner 126, camera 127 and optionally a joystick or other human interface device (not illustrated); and an interface 108 for the external modem 116 and printer 115. In some implementations, the modem 116 may be incorporated within the computer module 101, for example within the interface 108. The computer module 101 also has a local network interface 111, which permits coupling of the computer system 100 via a connection 123 to a local-area communications network 122, known as a Local Area Network (LAN). As illustrated in FIG. 1A, the local communications network 122 may also couple to the wide network 120 via a connection 124, which would typically include a so-called "firewall" device or device of similar functionality. The local network interface 111 may include an Ethernet circuit card, a Bluetooth® wireless arrangement or an IEEE 802.11 wireless arrangement; however, numerous other types of interfaces may be practiced for the interface 111.

The I/O interfaces 108 and 113 may afford either or both of serial or parallel connectivity; the former may be implemented according to the Universal Serial Bus (USB) standards and having corresponding USB connectors (not illustrated). Storage memory devices 109 are provided and typically include a hard disk drive (HDD) 110. Other storage devices such as a floppy disk drive and a magnetic tape drive (not illustrated) may also be used. An optical disk drive 112 is typically provided to act as a non-volatile source of data. Portable memory devices, such optical disks (e.g., CD-ROM, DVD, Blu-Ray™ Disc), USB-RAM, portable, external hard drives, and floppy disks, for example, may be used as appropriate sources of data to the system 100.

The components 105 to 113 of the computer module 101 typically communicate via an interconnected bus 104 and in a manner that results in a conventional mode of operation of the computer system 100 known to those in the relevant art. For example, the processor 105 is coupled to the system bus 104 using a connection 118. Likewise, the memory 106 and optical disk drive 112 are coupled to the system bus 104 by connections 119.

The techniques described in this specification may be implemented using the computer system 100, e.g., may be implemented as one or more software application programs 133 executable within the computer system 100. In some implementations, the one or more software application programs 133 execute on the computer server module 101 (the remote terminal 168 may also perform processing jointly with the computer server module 101), and a browser 171 executes on the processor 169 in the remote terminal, thereby enabling a user of the remote terminal 168 to access the software application programs 133 executing on the server 101 (which is often referred to as "the cloud") using the browser 171. In particular, the techniques described in this specification may be effected by instructions 131 (see FIG. 1B) in the software 133 that are carried out within the computer system 100. The software instructions 131 may be formed as one or more code modules, each for performing one or more particular tasks. The software may also be divided into two separate parts, in which a first part and the corresponding code modules performs the described techniques and a second part and the corresponding code modules manage a user interface between the first part and the user.

The software may be stored in a computer readable medium, including the storage devices described below, for example. The software is loaded into the computer system 100 from the computer readable medium, and then executed by the computer system 100. A computer readable medium having such software or computer program recorded on the computer readable medium is a computer program product. Software modules for that execute techniques described in this specification may also be distributed using a Web browser.

The software 133 is typically stored in the HDD 110 or the memory 106 (and possibly at least to some extent in the memory 172 of the remote terminal 168). The software is loaded into the computer system 100 from a computer readable medium, and executed by the computer system 100. Thus, for example, the software 133, which can include one or more programs, may be stored on an optically readable disk storage medium (e.g., CD-ROM) 125 that is read by the optical disk drive 112. A computer readable medium having such software or computer program recorded on it is a computer program product.

In some instances, the application programs 133 may be supplied to the user encoded on one or more CD-ROMs 125 and read via the corresponding drive 112, or alternatively may be read by the user from the networks 120 or 122. Still further, the software can also be loaded into the computer system 100 from other computer readable media. Computer readable storage media refers to any non-transitory tangible storage medium that provides recorded instructions and/or data to the computer system 100 for execution and/or processing. Examples of such storage media include floppy disks, magnetic tape, CD-ROM, DVD, Blu-Ray™ Disc, a hard disk drive, a ROM or integrated circuit, USB memory, a magneto-optical disk, or a computer readable card such as a PCMCIA card and the like, whether or not such devices are internal or external of the computer module 101. Examples of transitory or non-tangible computer readable transmission media that may also participate in the provision of software, application programs, instructions and/or data to the computer module 101 include radio or infra-red transmission channels as well as a network connection to another computer or networked device, and the Internet or Intranets including e-mail transmissions and information recorded on Websites and the like.

The second part of the application programs 133 and the corresponding code modules mentioned above may be executed to implement one or more graphical user interfaces (GUIs) to be rendered or otherwise represented upon the display 114. For example, through manipulation of the keyboard 102 and the mouse 103, a user of the computer system 100 and the application may manipulate the interface in a functionally adaptable manner to provide controlling commands and/or input to the applications associated with the GUI(s). Other forms of functionally adaptable user interfaces may also be implemented, such as an audio interface utilizing speech prompts output via the loudspeakers 117 and user voice commands input via the microphone 180.

FIG. 1B is a detailed schematic block diagram of the processor 105 and a "memory" 134. The memory 134 represents a logical aggregation of all the memory modules (including the HDD 109 and semiconductor memory 106) that can be accessed by the computer module 101 in FIG. 1A.

When the computer module 101 is initially powered up, a power-on self-test (POST) program 150 can execute. The POST program 150 can be stored in a ROM 149 of the semiconductor memory 106 of FIG. 1A. A hardware device such as the ROM 149 storing software is sometimes referred to as firmware. The POST program 150 examines hardware within the computer module 101 to ensure proper functioning and typically checks the processor 105, the memory 134 (109, 106), and a basic input-output systems software (BIOS) module 151, also typically stored in the ROM 149, for correct operation. Once the POST program 150 has run successfully, the BIOS 151 can activate the hard disk drive 110 of FIG. 1A. Activation of the hard disk drive 110 causes a bootstrap loader program 152 that is resident on the hard disk drive 110 to execute via the processor 105. This loads an operating system 153 into the RAM memory 106, upon which the operating system 153 commences operation. The operating system 153 is a system level application, executable by the processor 105, to fulfil various high-level functions, including processor management, memory management, device management, storage management, software application interface, and generic user interface.

The operating system 153 manages the memory 134 (109, 106) to ensure that each process or application running on the computer module 101 has sufficient memory in which to execute without colliding with memory allocated to another process. Furthermore, the different types of memory available in the system 100 of FIG. 1A must be used properly so that each process can run effectively. Accordingly, the aggregated memory 134 is not intended to illustrate how particular segments of memory are allocated (unless otherwise stated), but rather to provide a general view of the memory accessible by the computer system 100 and how such is used.

As shown in FIG. 1B, the processor 105 includes a number of functional modules including a control unit 139, an arithmetic logic unit (ALU) 140, and a local or internal memory 148, sometimes called a cache memory. The cache memory 148 typically includes a number of storage registers 144-146 in a register section. One or more internal busses 141 functionally interconnect these functional modules. The processor 105 typically also has one or more interfaces 142 for communicating with external devices via the system bus 104, using a connection 118. The memory 134 is coupled to the bus 104 using a connection 119.

The application program 133 includes a sequence of instructions 131 that may include conditional branch and loop instructions. The program 133 may also include data 132 which is used in execution of the program 133. The instructions 131 and the data 132 are stored in memory locations 128, 129, 130 and 135, 136, 137, respectively. Depending upon the relative size of the instructions 131 and the memory locations 128-130, a particular instruction may be stored in a single memory location as depicted by the instruction shown in the memory location 130. Alternately, an instruction may be segmented into a number of parts each of which is stored in a separate memory location, as depicted by the instruction segments shown in the memory locations 128 and 129.

In general, the processor 105 is given a set of instructions which are executed therein. The processor 105 waits for a subsequent input, to which the processor 105 reacts to by executing another set of instructions. Each input may be provided from one or more of a number of sources, including data generated by one or more of the input devices 102, 103, data received from an external source 173, e.g., a brain imaging device 173 such as an MRI or DTI scanner, across one of the networks 120, 122, data retrieved from one of the storage devices 106, 109 or data retrieved from a storage medium 125 inserted into the corresponding reader 112, all depicted in FIG. 1A. The execution of a set of the instructions may in some cases result in output of data. Execution may also involve storing data or variables to the memory 134.

Some techniques described in this specification use input variables 154, e.g., data sets characterizing the brain of a subject, which are stored in the memory 134 in corresponding memory locations 155, 156, 157. The techniques can produce output variables 161, which are stored in the memory 134 in corresponding memory locations 162, 163, 164. Intermediate variables 158 may be stored in memory locations 159, 160, 166 and 167.

Referring to the processor 105 of FIG. 1B, the registers 144, 145, 146, the arithmetic logic unit (ALU) 140, and the control unit 139 work together to perform sequences of micro-operations needed to perform "fetch, decode, and execute" cycles for every instruction in the instruction set making up the program 133. Each fetch, decode, and execute cycle can include i) a fetch operation, which fetches or reads an instruction 131 from a memory location 128, 129, 130; ii) a decode operation in which the control unit 139 determines which instruction has been fetched; and iii) an execute operation in which the control unit 139 and/or the ALU 140 execute the instruction.

Thereafter, a further fetch, decode, and execute cycle for the next instruction may be executed. Similarly, a store cycle may be performed by which the control unit 139 stores or writes a value to a memory location 132.

Each step or sub-process in the techniques described in this specification may be associated with one or more segments of the program 133 and is performed by the register section 144, 145, 146, the ALU 140, and the control unit 139 in the processor 105 working together to perform the fetch, decode, and execute cycles for every instruction in the instruction set for the noted segments of the program 133. Although a cloud-based platform has been described for practicing the techniques described in this specification, other platform configurations can also be used. Furthermore, other hardware/software configurations and distributions can also be used for practicing the techniques described in this specification.

Figure 2:
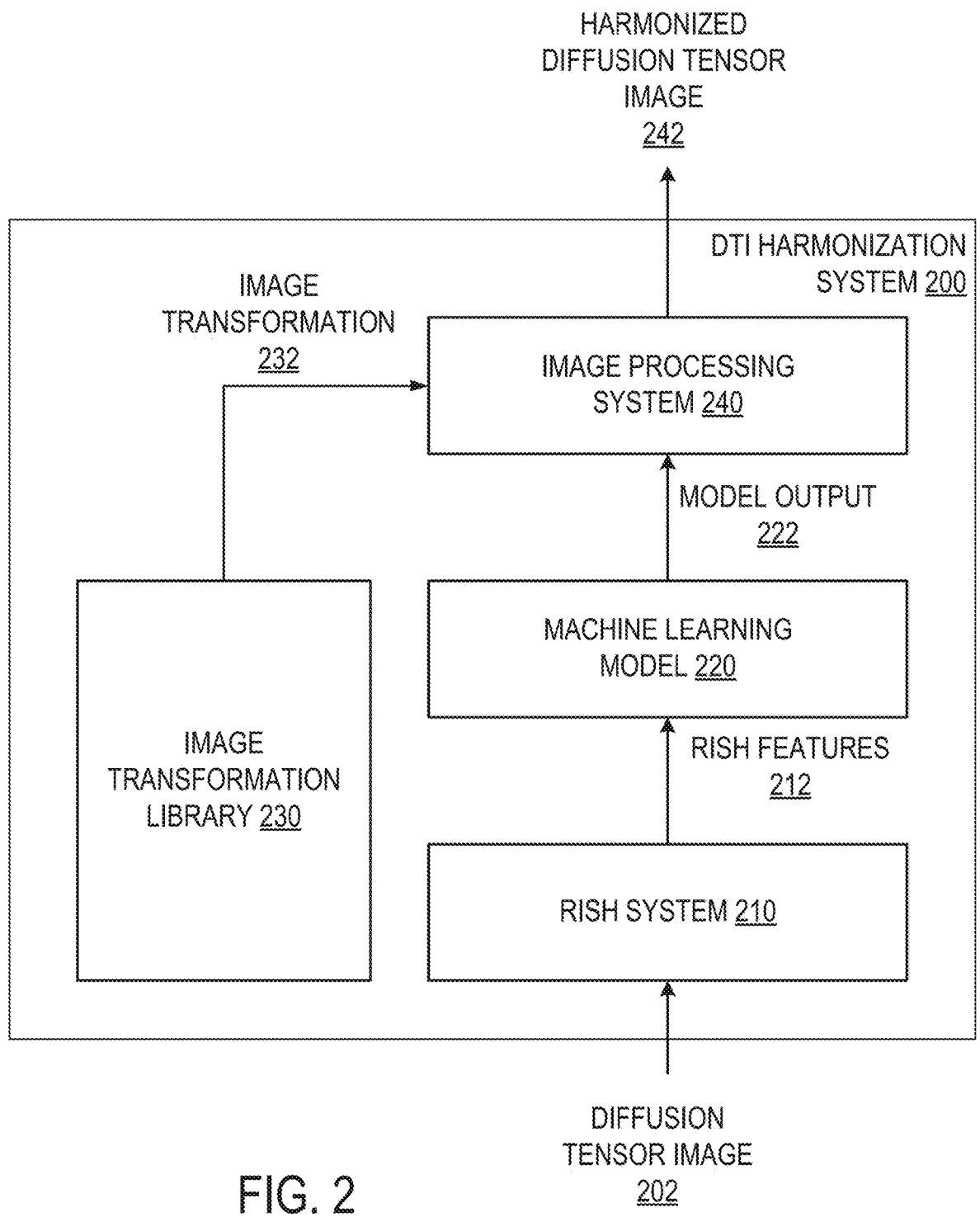
FIG. 2 is a diagram of an example DTI harmonization system.

FIG. 2 is a diagram of an example diffusion tensor imaging (DTI) harmonization system 200. The DTI harmonization system 200 is an example of a system implemented as computer programs on one or more computers in one or more locations, in which the systems, components and techniques described below can be implemented.

The DTI harmonization system 200 is configured to obtain a diffusion tensor image 202 and to process the diffusion tensor image 202 to harmonize the diffusion tensor image 202 with a set of other diffusion tensor images, generating a harmonized diffusion tensor image 242. Each diffusion tensor image in the set can characterize the brain of a respective different subject, or the same subject at respective different time points. The set of diffusion tensor images does not have to be predetermined before generating the harmonized diffusion tensor images 242; that is, the DTI harmonization system 200 can continuously obtain new diffusion tensor images 202 and generate harmonized diffusion tensor images 242.

Figure 3:
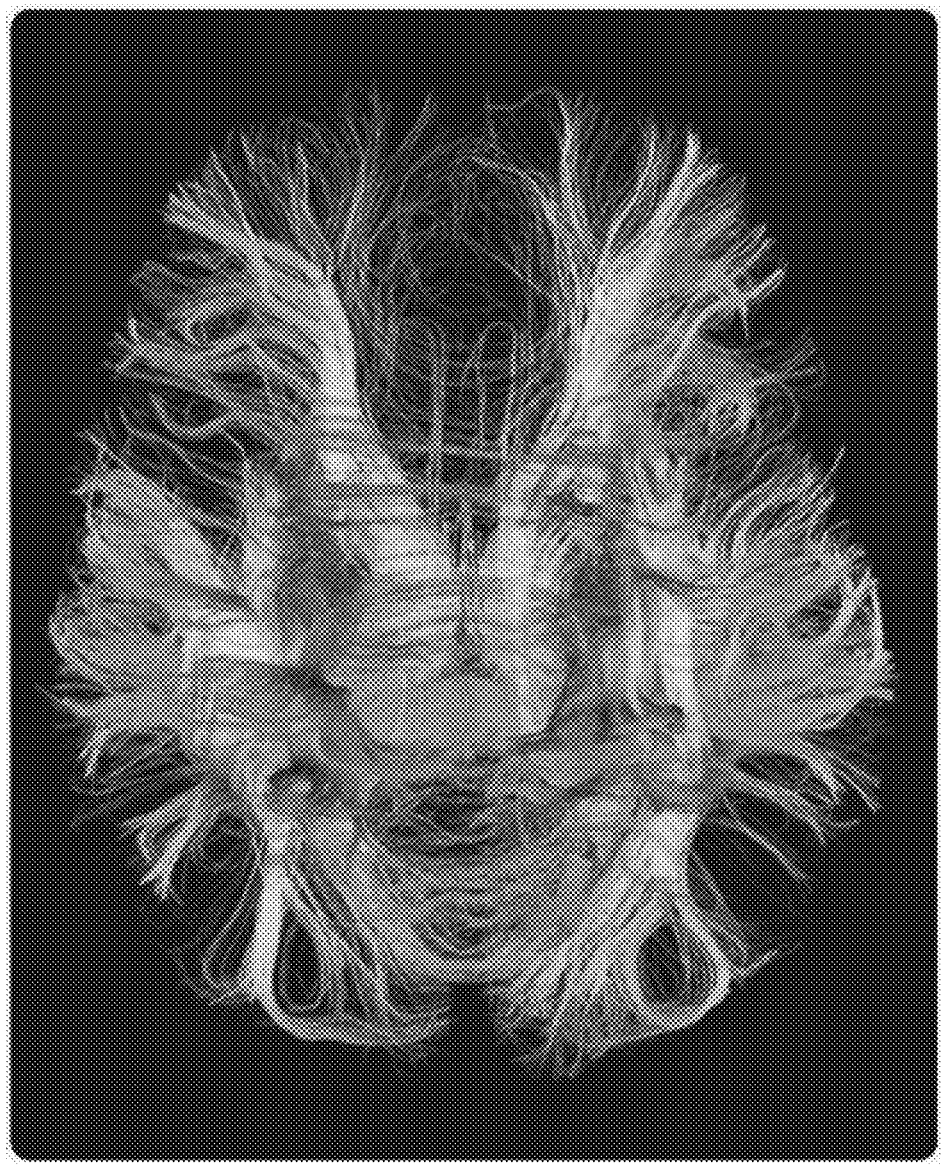
FIG. 3 illustrates example brain tracts measured using diffusion tensor imaging.

Diffusion tensor images 202 can be used to identify white matter tracts in the brain of the subject. FIG. 3 illustrates example brain tracts 300 measured using diffusion tractography imaging. In particular, each brain tract 300 can extend from one voxel in a grid of voxels defined by the diffusion tensor image 202 to another voxel in the grid of voxels.

Referring back to FIG. 2, each of the diffusion tensor images 202 in the set can be generated by a different MRI scanner, and thus there can be a variance between the diffusion tensor images 202 in the set caused by differences between the MRI scanners, as described above. By processing each diffusion tensor image 202 in the set to generate respective harmonized diffusion tensor images 242, the DTI harmonization system 200 can significantly reduce or eliminate this variance, so that any differences between the harmonized diffusion tensor images 242 are primarily and quantitatively indicative of real, measured differences in the brains of the corresponding subjects. In particular, each harmonized diffusion tensor image 242 can resemble images generated by the same MRI scanner, called the "reference" MRI scanner. In other words, the harmonized diffusion tensor images 242 can conform to the same image distribution as the diffusion tensor images generated by the reference MRI scanner, e.g., a d-dimensional image distribution where d is the number of features in a single diffusion tensor image. For convenience, in this specification MRI scanners that are not the reference MRI scanner are sometimes called "nonreference" MRI scanners.

For example, by harmonizing the diffusion tensor images 202 to generate respective harmonized diffusion tensor images 242, the DTI harmonization system 200 can significantly reduce or eliminate the difference between (i) a distribution of a parameter characterizing the diffusion tensor images generated by the reference MRI scanner and (ii) a respective distribution of the parameter corresponding to each nonreference MRI scanner. Example DTI parameters whose distributions can be harmonized through DTI harmonization can include (i) the number of tracts measured in diffusion tensor images generated by respective MRI scanners, (ii) the FA values of diffusion tensor images generated by respective MRI scanners. (iii) the modularity values of diffusion tensor images generated by respective MRI scanners, (iv) the path lengths of diffusion tensor images generated by respective MRI scanners, (v) the global efficiency values of diffusion tensor images generated by respective MRI scanners or (vi) measure of centrality of elements in diffusion tensor images generated by respective MRI scanners. Example distributions for comparing the diffusion tensor images generated by respective different MRI scanners are discussed in more detail below with reference to FIG. 5. The amount of difference that is reduced via harmonization depends on the parameter involved and the amount of difference that exists at the outset. Some sites/scanners are very similar to each other while others may be very different. Thus harmonization can reduce the difference by more than 10%, 25%, 50%, 75% or 90% depending on the differences at the outset and the parameter involved.

The DTI harmonization system 200 includes a rotation-invariant spherical harmonic (RISH) system 210, a machine learning model 220, an image transformation library 230, and an image processing system 240.

The RISH system 210 is configured to process the diffusion tensor image 202 to generate a set of rotation-invariant spherical harmonic (RISH) features 212 of the diffusion tensor image 202.

Generally, the set of RISH features 212 includes a respective subset of RISH features corresponding to each of multiple regions of the brain of the subject. For example, the diffusion tensor image 202 can include a respective signal for each voxel in a voxel grid, and the set of RISH features 212 can include respective RISH features for each voxel in the voxel grid. In this specification, a RISH feature of a diffusion tensor image is any feature of the image that (i) is rotation invariant, i.e., is unaffected by an arbitrary rotation of the diffusion tensor image, and (ii) has been generated using a spherical harmonic representation of the diffusion tensor image.

For example, for each signal S corresponding to a respective voxel of the diffusion tensor image 202, the RISH system 210 can determine the spherical harmonic representation of the signal S to be:

$$S=\Sigma_l \Sigma_m C_{l,m} Y_{l,m}$$

where $Y_{l,m}$ is the spherical harmonic basis function of order l and degree m, and $C_{l,m}$ is a set of coefficients.

The RISH system 210 can then generate RISH features for the voxel of the diffusion tensor image 202 using the coefficients $C_{l,m}$, which uniquely define the signal S of the voxel. For example, the RISH system 210 can generate n RISH features F corresponding to the voxel by computing:

$$F = \left[\|C_0\|^2, \|C_1\|^2, \ldots, \|C_n\|^2\right], \text{where} \|C_l\| = \sum_{m=1}^{2l+1} (C_{l,m})^2$$

The RISH features 212 can be defined such that they can be scaled to modify the respective signals S of voxels of the diffusion tensor image without changing the principal diffusion directions of the fibers represented by the diffusion tensor image. Therefore, the RISH features 212 can be modified to harmonize the diffusion tensor image 202 with the reference MRI scanner. In other words, an image transformation that is to be applied to a diffusion tensor image to harmonize the diffusion tensor image can define a function, e.g., a linear scaling function, to be applied to the RISH features of the diffusion tensor image.

The image transformation library 230 is configured to store multiple different image transformations 232. In this specification, an image transformation is any function that can be applied to an image to modify the image. The image transformations 232 stored in the image transformation library 230 are configured to be applied to diffusion tensor images 202 to harmonize the images with the reference MRI scanner.

Each image transformation 232 in the image transformation library 230 can correspond to a respective different set of one or more nonreference MRI scanners. That is, each image transformation 232 can be configured to be applied to diffusion tensor images generated by the one or more corresponding nonreference MRI scanners in order to harmonize the diffusion tensor images with the reference MRI scanner. Importantly, however, the image transformation 232 can also be applied to diffusion tensor images that were not generated by the one or more corresponding nonreference MRI scanners, e.g., to diffusion tensor images that share one or more qualities with the images generated by the corresponding nonreference MRI scanners.

Each image transformation 232 can be generated using (i) diffusion tensor images generated by the one or more corresponding nonreference MRI scanners and (ii) diffusion tensor images generated by the reference MRI scanner. An example system for generating image transformations is discussed below with reference to FIG. 4.

The machine learning model 220 is configured to process a model input that includes the RISH features 212 of the diffusion tensor image 202 and to generate a model output 222 that identifies a particular image transformation 232 from the image transformation library 230 that should be applied to the diffusion tensor image 202 to harmonize the image 202 with the reference MRI scanner.

During training of the machine learning model 220, the model 220 can learn, for each image transformation 232 in the image transformation library 230, patterns in the diffusion tensor images generated by the one or more nonreference MRI scanners corresponding to the image transformation 232. In particular, the machine learning model 220 can process RISH features of the diffusion tensor images generated by the one or more corresponding nonreference MRI scanners to learn patterns in the RISH features. Then, when processing the RISH features 212 of a new diffusion tensor image 202 generated by a different nonreference MRI scanner (i.e., an MRI scanner that does not correspond to any of the image transformations 232) or by an unknown MRI scanner, the machine learning model 220 can be configured through training to generate a model output 222 that identifies the image transformation 232 corresponding to the one or more nonreference MRI scanners that generate diffusion tensor images most similar to the new diffusion tensor image 202. Because the new diffusion tensor image 202 shares similar features with the images generated by the one or more nonreference MRI scanners corresponding to the identified image transformation 232, the identified image transformation 232 can be applied to the new diffusion tensor image 202 to harmonize the new diffusion tensor image 202 with the reference MRI scanner.

For example, in response to processing the RISH features 212 of the diffusion tensor image 202, the machine learning model 220 can generate a model output 222 that includes, for each image transformation 232 in the image transformation library 230, a respective similarity score that represents a degree to which the diffusion tensor image 202 is similar to the diffusion tensor images generated by the one or more nonreference MRI scanners corresponding to the image transformation 232. As a particular example, each similarity score can be a value between zero and one. The machine learning model 220 can then determine that the image transformation 232 with the highest similarity score should be applied to the diffusion tensor image 202.

The machine learning model 220 can have any appropriate model architecture to generate the model output 222.

For example, the machine learning model 220 can be a convolutional neural network that includes one or more convolutional neural network layers that are each configured to process the RISH features 212 using a three-dimensional convolutional filter. As described above, the set of RISH features 212 can include a respective set of RISH features for each of multiple regions of the brain of the subject, e.g., a respective set of RISH features for each voxel in a voxel grid. Thus, the RISH features 212 can be represented by a three-dimensional tensor, where each element of the three-dimensional tensor corresponds to a respective region of the brain of the subject such that the element has a value equal to the set of RISH features for that region of the brain. That is, for each element in the three-dimensional tensor representing the brain, the element can have a value that is a vector that includes the set of RISH features for the region of the brain represented by the element. The machine learning model 220 can thus apply a sequence of one or more learned three-dimensional convolutional filters to the three-dimensional tensor to generate the model output 222.

In some implementations, before performing convolution on the three-dimensional tensor, the machine learning model 220 pads the three-dimensional tensor with elements having value zero to generate an updated three-dimensional tensor that has a predetermined shape, e.g., to generate an updated three-dimensional tensor that is a cuboid.

As another example, the machine learning model 220 can be a feedforward neural network that is configured to process the RISH features 212 using one or more feedforward neural network layers. That is, if there are N total RISH features in the set of RISH features 212, then the feedforward neural network can be configured to process an N×1 vector using the one or more feedforward neural network layers.

As another example, the machine learning model 220 can be a random forest model that is configured to process the RISH features 212 using a set of decision trees.

In some implementations, the model input to the machine learning model 220 includes only the RISH features 212. In some other implementations, the model input can include (or be generated from) other features of the diffusion tensor image 202. For example, the model input can include (or be generated from) diffusion-weighted imaging (DWI) features generated from the diffusion tensor image 202, e.g., FA values, tract metrics of the diffusion tensor image 202, and/or graph metrics of a graph generated from the diffusion tensor image 202. As another example, the model input can include (or be generated from) data characterizing scanner-specific details of the scanner that captured the diffusion tensor image 202, and/or site-specific details of the site at which the diffusion tensor image 202 was captured.

The machine learning model 220 can provide the model output 222 to the image processing system 240. The image processing system 240 can then obtain the image transformation 232 identified by the model output 222 from the image transformation library 230. The image processing system 240 is configured to apply the image transformation 232 to the diffusion tensor image 202 to generate the harmonized diffusion tensor image 242.

The image transformation 232 can be configured to modify the RISH features 212, and can be generated from a difference between (i) a set of RISH features corresponding to reference MRI scanner and (ii) a set of RISH features corresponding to the one or more nonreference MRI scanners of the image transformation 232. In particular, for each of multiple regions of the brain of the subject, e.g., for each voxel in a voxel grid, the image transformation 232 can identify a mapping between (i) RISH features of the region in diffusion tensor images generated by the reference MRI scanner and (ii) RISH features of the region in diffusion tensor images generated by the one or more nonreference MRI scanners of the image transformation 232. When the mapping is applied to the RISH features 212 corresponding to each region, the RISH features 212 can be aligned with the set of RISH features corresponding to the reference MRI scanner. The image processing system 240 can then apply the updated RISH features 212 to the diffusion tensor image 202 to generate the harmonized diffusion tensor image 242. This process is described in more detail below with reference to FIG. 4.

After generating the harmonized diffusion tensor image 242, the DTI harmonization system 200 can provide the harmonized diffusion tensor image 242 to one or more other systems. For example, the DTI harmonization system 200 can provide the harmonized diffusion tensor image 242 to a storage system for storing the harmonized diffusion tensor image 242, e.g., a storage system accessible by researchers conducting a study using the harmonized diffusion tensor image 242. As another example, the DTI harmonization system 200 can provide the harmonized diffusion tensor image 242 to a user device for display to a user, e.g., for display to a clinician who is treating the subject. As another example, the DTI harmonization system 200 can provide the harmonized diffusion tensor image 242 to one or more downstream machine learning models for further processing.

Figure 4:
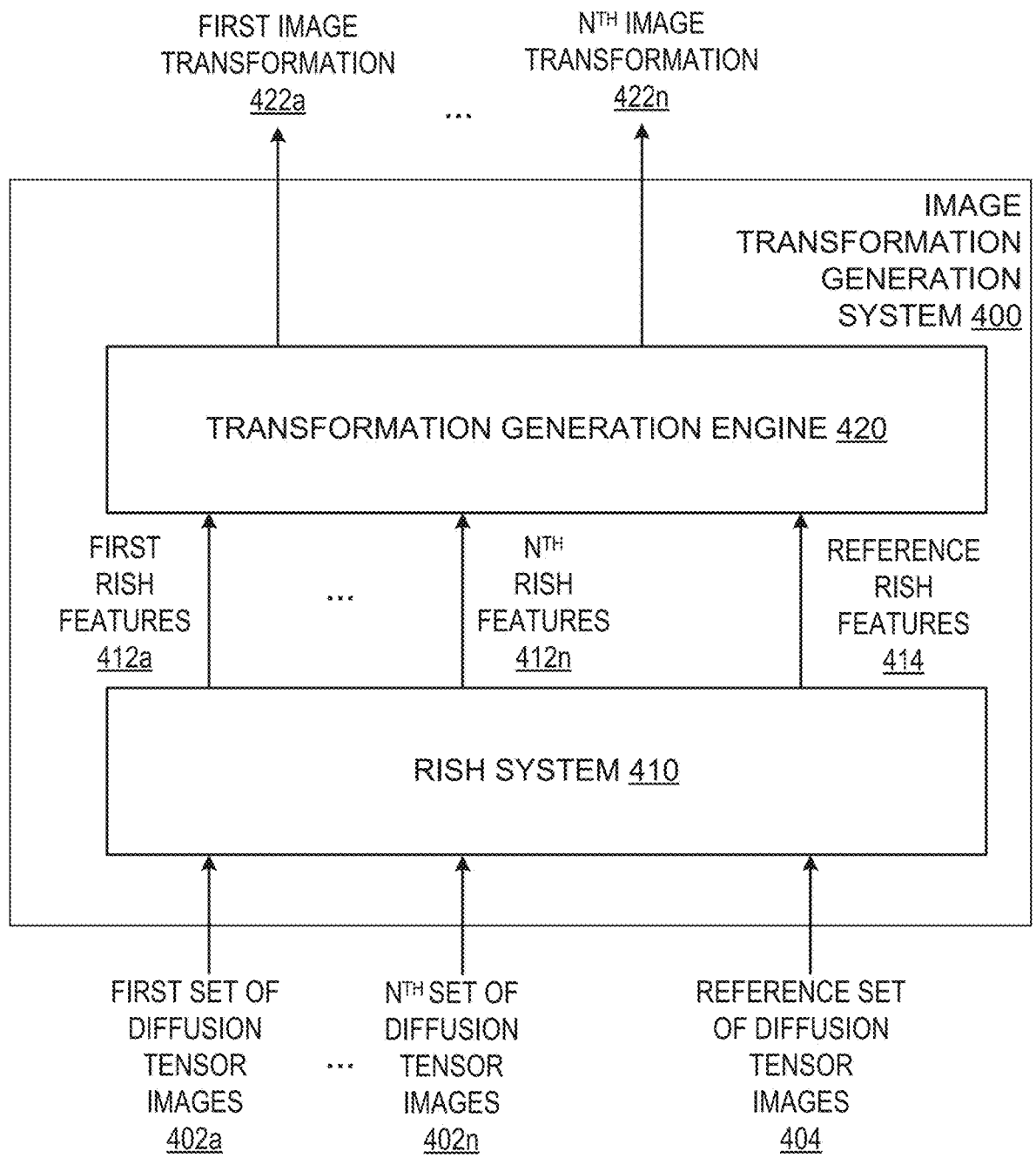
FIG. 4 is a diagram of an example image transformation generation system.

FIG. 4 is a diagram of an example image transformation generation system 400. The image transformation generation system 400 is an example of a system implemented as computer programs on one or more computers in one or more locations, in which the systems, components and techniques described below can be implemented.

The image transformation generation system 400 is configured to generate, for each of N different nonreference MRI scanners, a respective image transformation 422a-n that can be applied to diffusion tensor images generated by the nonreference MRI scanner to harmonize the diffusion tensor image with a reference MRI scanner. As described above with reference to FIG. 2, the image transformation 422a-n corresponding to a particular nonreference MRI scanner can be applied to diffusion tensor images that were not generated by the particular nonreference MRI scanner but that share similarities with the diffusion tensor images generated by the particular nonreference MRI scanner.

In particular, the image generation system 400 is configured to generate the image transformations 422a-n using (i) a respective set of one or more diffusion tensor images 402a-n generated by each of the N different nonreference MRI scanners, and (ii) a set of one or more diffusion tensor images 404 generated by the reference MRI scanner.

Importantly, it is not necessarily the case that the N nonreference MRI scanners generate diffusion tensor generate images that are "incorrect" while the reference MRI scanner generates diffusion tensor images that are "correct." While it is possible for some MRI scanners to generate diffusion tensor images of lower quality than other MRI scanners, it is generally impossible or infeasible to determine a "ground-truth" diffusion tensor image of the brain of a subject.

A user or an external system can select a reference MRI scanner from a set of MRI scanners whose diffusion tensor images are to be harmonized. In some implementations, the reference MRI scanner is randomly selected, e.g., according to a uniform distribution across the set of MRI scanners. That is, in some implementations it is not consequential which MRI scanner is determined to be the reference MRI scanner as long as the diffusion tensor images are harmonized consistently.

In some other implementations, the user or the external system can select the reference MRI scanner to be the MRI scanner in the set of MRI scanners that generates diffusion tensor images of the highest quality. That is, while the variability between the diffusion tensor images generated by different MRI scanners in the set is not necessarily primarily caused by a difference in the quality of the diffusion tensor images, nevertheless different MRI scanners can generate images of different qualities. For example, an external system can process, for each MRI scanner in the set, one or more diffusion tensor images generated by the MRI scanner to generate a score for the MRI scanner that represents a quality of the images generated by the MRI scanner. The system can then select the MRI scanner with the highest score to be the reference MRI scanner. The system can use any appropriate metric, or set of metrics, to determine the scores for the MRI scanners. For example, the system can determine that MRI scanners that can generate diffusion tensor images with a higher resolution, more directions, or a larger field of view have a higher score than MRI scanners that can generate diffusion tensor images with a lower resolution, fewer directions, or a smaller field of view. As another example, the system can determine the scores according to the signal-to-noise ratio (SNR) of the images generated by respective MRI scanners. As another example, the system can determine the scores according to whether the images generated by respective MRI scanners have measurable visual artefacts, e.g., artefacts caused by head movement, disrupted magnetic fields, and so on.

In some other implementations, the user or the external system can select the reference MRI scanner to be a "typical" MRI scanner in the set of MRI scanners. For example, the external system can determine the reference MRI scanner to be the MRI scanner in the set of MRI scanners that has the median resolution or number of directions. It can be useful to select a "typical" MRI scanner to be the reference scanner, as opposed to an exceptional MRI scanner in the set (e.g., as opposed to the MRI scanner that generates images of the highest quality), because it can be difficult or impossible to harmonize all of the MRI scanners with the exceptional MRI scanner. That is, given a metric by which to measure the MRI scanners, it may be infeasible to harmonize the MRI scanner that has the lowest value for the metric with the MRI scanner that has the highest value for the metric, whereas it may be feasible to harmonize both the MRI scanner that has the lowest value and the MRI scanner that has the highest value with the MRI scanner that has the median value for the metric.

Referring back to FIG. 4, the image transformation generation system 400 includes a RISH system 410 and a transformation generation engine 420.

The RISH system 410 can be configured to process, for each of the N nonreference MRI scanners, the corresponding set of diffusion tensor images 402a-n to generate a set of RISH features 412a-n for the MRI scanner. For example, for each diffusion tensor image in the set of diffusion tensor images 402a-n corresponding to the MRI scanner, the RISH system 410 can generate a respective initial set of RISH features as described above with reference to FIG. 2. The RISH system 410 can then combine the generated initial sets of RISH features (corresponding to respective diffusion tensor images 402a-n) to generate the final set of RISH features 412a-n for the MRI scanner. For example, the RISH system 410 can determine the set of RISH features 412a-n to be the mean of the initial sets of RISH features.

Similarly, the RISH system 410 can process the set of diffusion tensor images 404 generated by the reference MRI scanner to generate a set of RISH features 414 for the reference MRI scanner.

The transformation generation engine 420 can be configured to process (i) the sets of RISH features 412a-n of the N nonreference MRI scanners and (ii) the set of RISH features 414 of the reference MRI scanner to generate the N image transformations 422a-n corresponding to respective nonreference MRI scanners.

For each nonreference MRI scanner, the transformation generation engine 420 can determine a mapping between (i) the set of RISH features 412a-n of the nonreference scanner and (ii) the set of RISH features 414 of the reference MRI scanner. The mapping can include a respective mapping for each of multiple regions of the brain of the subject.

For example, for each of the multiple regions, the mapping can identify a scaling factor to apply to the RISH features 412a-n of the nonreference scanner corresponding to the region. By applying the respective scaling factor to the RISH features 412a-n corresponding to each region, a system can generate an updated set of RISH features that, when used to recompose a diffusion tensor image, generates an image that is harmonized with the reference scanner. In other words, given a diffusion tensor image generated by the nonreference MRI scanner corresponding to an image transformation 422a-n (or a diffusion tensor image similar to the images generated by the nonreference MRI scanner), the diffusion tensor image can be harmonized by (i) determining the RISH features of the image, (ii) scaling the RISH features of the image according to the mapping identified by the image transformation 422a-n to generate updated RISH features, and (iii) recomposing a diffusion tensor image from the updated RISH features.

After generating the N image transformations 422a-n, the image transformation generation system 400 can provide them to an image transformation library, e.g., the image transformation library 230 depicted in FIG. 2. A DTI harmonization system, e.g., the DTI harmonization system 200 depicted in FIG. 2, can then use the image transformations 422a-n to harmonize diffusion tensor images with the reference MRI scanner.

In some implementations, after generating an initial set of N image transformations 422a-n corresponding to respective nonreference MRI scanners, the image transformation generation system 400 can iteratively generate one or more additional image transformations corresponding to other respective nonreference MRI scanners.

For example, an external system (e.g., the DTI harmonization system 200 depicted in FIG. 2) can determine that the diffusion tensor images generated by a particular nonreference MRI scanner are not similar to the images generated by any of the nonreference MRI scanners corresponding to the N initial image transformations 422a-n, and thus that a new image transformation corresponding to the particular nonreference MRI scanner should be generated.

As a particular example, the system can compare (i) a distribution of the diffusion tensor images generated by the particular nonreference MRI scanner and (ii) a respective distribution of the diffusion tensor images generated by each of the nonreference MRI scanners corresponding to the initial image transformations 422a-n. If the system determines that the former distribution is dissimilar to each of the latter distributions, e.g., that the distributions satisfy one or more predetermined conditions for dissimilarity, then the system can determine to submit a request to the image transformation generation system 400 to generate an image transformation corresponding to the particular nonreference MRI scanner.

The system can use any appropriate distribution characterizing the respective MRI scanners to make the above determination. For example, the system can determine that the difference between the distribution of the number of tracts measured in diffusion tensor images generated by (i) the particular nonreference MRI scanner and (ii) each of the nonreference MRI scanners corresponding to the initial image transformations 422a-n is statistically significant (e.g., exceeds a particular p-value), or that the difference between the average number of tracts measured in the two sets of diffusion tensor images satisfies a predetermined threshold. Instead or in addition, the system can determine that the difference between the distribution of FA values of the diffusion tensor images generated by (i) the particular nonreference MRI scanner and (ii) each of the nonreference MRI scanners corresponding to the initial image transformations 422*a-n* is statistically significant, or that the difference between the average FA values of the two sets of diffusion tensor images satisfies a second predetermined threshold. Instead or in addition, the system can determine that the difference between the distribution of modularity values of the diffusion tensor images generated by (i) the particular nonreference MRI scanner and (ii) each of the nonreference MRI scanners corresponding to the initial image transformations 422*a-n* is statistically significant, or that the difference between the average modularity values in the two sets of diffusion tensor images satisfies a third predetermined threshold. Instead or in addition, the system can determine that the difference between the distribution of path lengths of the diffusion tensor images generated by (i) the particular nonreference MRI scanner and (ii) each of the nonreference MRI scanners corresponding to the initial image transformations 422*a-n* is statistically significant, or that the difference between the average path lengths in the two sets of diffusion tensor images satisfies a fourth predetermined threshold. Instead or in addition, the system can determine that the difference between the distribution of global efficiency values of the diffusion tensor images generated by (i) the particular nonreference MRI scanner and (ii) each of the nonreference MRI scanners corresponding to the initial image transformations 422*a-n* is statistically significant, or that the difference between the average global efficiency values in the two sets of diffusion tensor images satisfies a fifth predetermined threshold.

Example distributions for comparing the diffusion tensor images generated by respective different MRI scanners are discussed in more detail below with reference to FIG. 5.

Typically, each time a new image transformation is added to the image transformation library, the machine learning model (e.g., the machine learning model 220 depicted in FIG. 2) that assigns image transformations to diffusion tensor images is retrained. For example, as described above, the machine learning model can be configured to generate, for each image transformation in the library, a respective score; in these implementations, the machine learning model must be retrained to generate scores for the new image transformations added to the library. An example training system is described below with reference to FIG. 6.

In some implementations, the image transformation generation system 400 can generate a single image transformation 422*a-n* corresponding to multiple different nonreference MRI scanners. For example, the image transformation generation system 400 (or an external system) can determine that the multiple different MRI scanners generate similar diffusion tensor images (e.g., according to the average number of tracts measured in the diffusion tensor images or the average FA values of the diffusion tensor images, as described above), and thus that a single image transformation can be applied to the diffusion tensor images generated by each of the multiple different MRI scanners (and diffusion tensor images that are similar to those generated by the multiple different MRI scanners).

In some implementations, after generating the image transformations 422*a-n*, each image transformation 422*a-n* can be evaluated to determine whether it effectively harmonizes diffusion tensor images with the reference MRI scanner. For example, for each image transformation 422*a-n*, a system (e.g., the DTI harmonization system 200 depicted in FIG. 2) can compare (i) a distribution of the harmonized diffusion tensor images generated by the one or more nonreference MRI scanners corresponding to the image transformation 422*a-n* and (ii) a distribution of the diffusion tensor images generated by the reference MRI scanner. Generally, the image transformation can be considered effective if the two distributions are determined to be similar.

Figure 5:
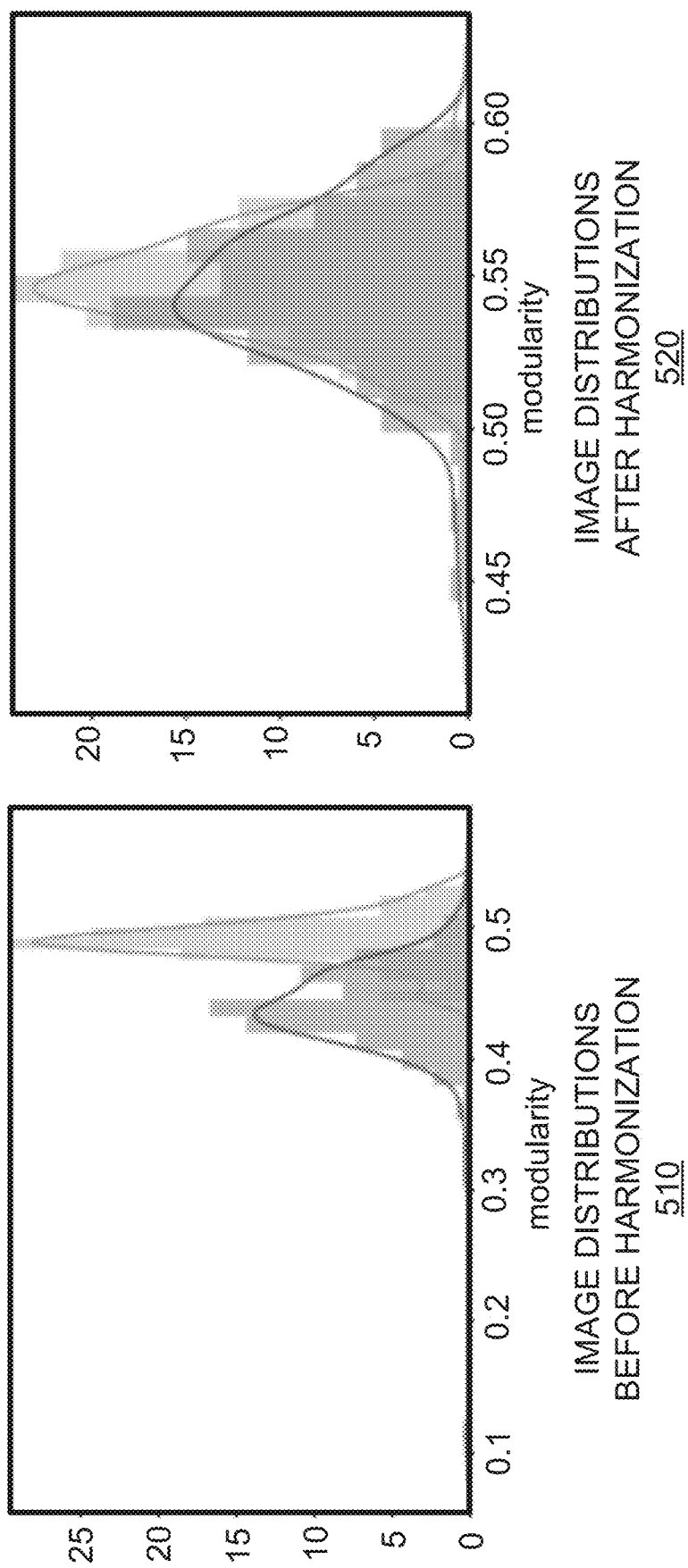
FIG. 5 illustrates example distributions of diffusion tensor images before and after harmonization.

FIG. 5 illustrates example distributions of diffusion tensor images before and after harmonization.

On the left are illustrated two distributions 510, corresponding to respective nonreference MRI scanners, of the modularity of diffusion tensor images generated by the nonreference MRI scanners before the images are harmonized with a reference MRI scanner. Modularity is a metric for diffusion tensor images that measures the segregation of different regions in the brain of the subject; that is, a higher modularity indicates fewer white matter connections between respective regions of the brain (e.g., between respective voxels in a voxel grid of the brain). The distributions 510 can be generated by obtaining, for both of the nonreference MRI scanners, multiple diffusion tensor images generated by the nonreference MRI scanner; processing the multiple diffusion tensor images to determine respective modularity values for each image; and generating statistics for the determined modularity values, e.g., a mean of the modularity values, a standard deviation of the modularity values, and so on.

Generally, the distribution of the modularity of diffusion tensor images generated by different MRI scanners should be consistent. However, because the diffusion tensor images used to generate the distributions 510 have not been harmonized yet, the distributions 510 indicate one of the nonreference MRI scanners (corresponding to the darker distribution) generates diffusion tensor images that tend to have lower modularity values than the diffusion tensor images generated by the other nonreference MRI scanner (corresponding to the lighter distribution). Similarly, the distributions 510 indicate that the variance of the modularity values of the diffusion tensor images generated by one of the nonreference MRI scanners (corresponding to the darker distribution) is larger than the variance of the modularity values of the diffusion tensor images generated by the other nonreference MRI scanner (corresponding to the lighter distribution).

On the right are illustrated two distributions 520, corresponding to the same respective nonreference MRI scanners represented by the distributions 510, of the modularity of diffusion tensor images generated by the nonreference MRI scanners after the images have been harmonized by a DTI harmonization system, e.g., the DTI harmonization system 200 depicted in FIG. 2.

The harmonization of the diffusion tensor images has caused the distributions of the modularity values of the images generated by the two respective nonreference MRI scanners to become significantly more similar. In particular, harmonization has aligned the respective means of the two distributions 520, at a modularity value of approximately 0.55. Similarly, although the respective variances of the distributions 520 are not exactly equal, they are more similar than before harmonization. That is, harmonization has caused respective variances of the modularity values of the harmonized diffusion tensor images generated by the two nonreference MRI scanners to be significantly more aligned.

Figure 6:
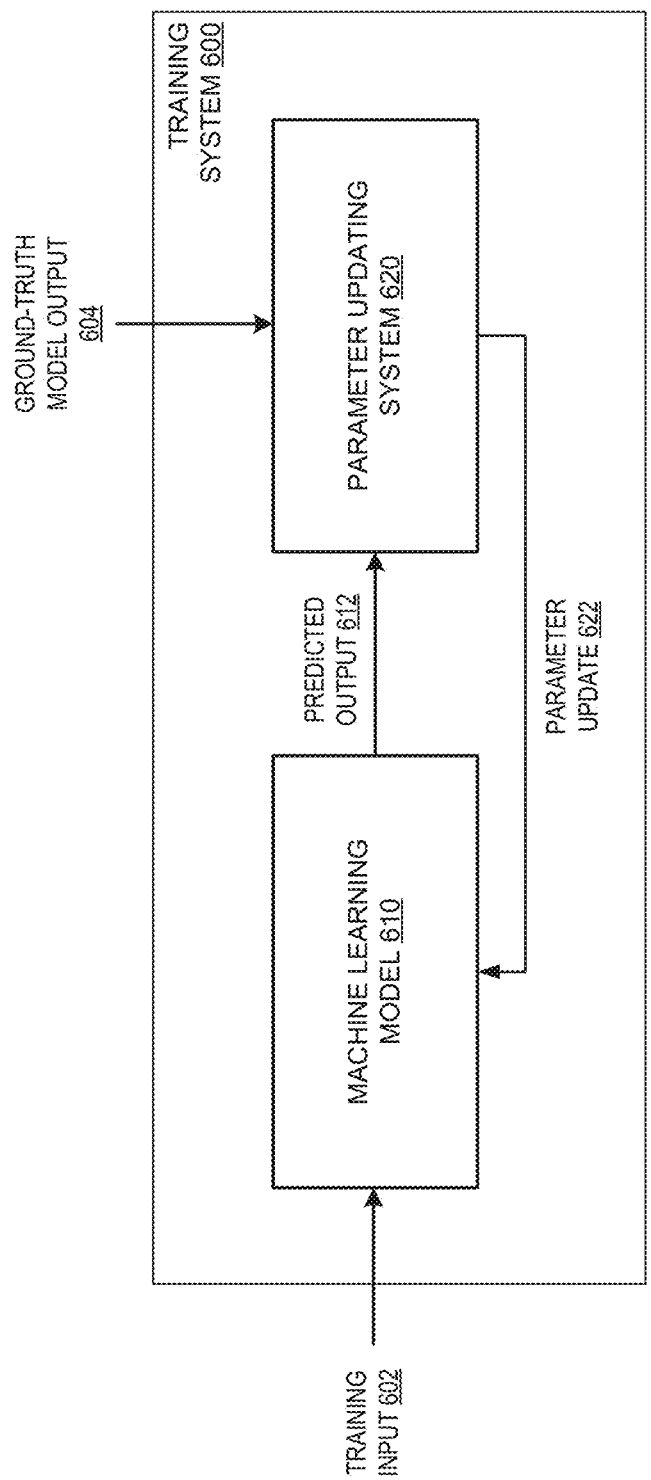
FIG. 6 is a diagram of an example training system.

FIG. 6 is a diagram of an example training system 600. The training system 600 is an example of a system implemented as computer programs on one or more computers in one or more locations, in which the systems, components and techniques described below can be implemented.

The training system 600 is configured to train a machine learning model 610 to process a model input characterizing a diffusion tensor image and to generate a model output identifying an image transformation, from a predetermined set of image transformations, that can be applied to the diffusion tensor image to harmonize the image with a reference MRI scanner. The machine learning model 610 can have any appropriate model architecture. For example, as described above, the machine learning model 610 can include one or more of a convolutional neural network or a feedforward neural network.

To train the machine learning model 610, the training system 600 can obtain a training input 602 corresponding to a diffusion tensor image generated by a nonreference MRI scanner corresponding to a particular image transformation of the image transformations in the predetermined set of image transformations. That is, the particular image transformation is configured to harmonize images generated by the nonreference MRI scanner that generated the diffusion tensor image corresponding to the training input 602 (or images similar to those generated by the nonreference MRI scanner). The training input 602 can include a set of RISH features of the diffusion tensor image.

The training system 600 can process the training input 602 using the machine learning model 612 to generate a predicted model output 612 that identifies one of the image transformations in the predetermined set of image transformations. For example, the predicted model output 612 can include a respective score for each image transformation in the predetermined set.

The training system 600 can provide the predicted model output 612 to the parameter updating system 620, which is configured to determine a parameter update 622 to the parameters of the machine learning model 610 according to an error in the predicted model output 612.

To determine the error in the predicted model output 612, the parameter updating system 620 can obtain a ground-truth model output 604 that represents the model output that the machine learning model 610 should generate in response to processing the training input 602. The ground-truth model output 604 can identify the particular image transformation that should be applied to the diffusion tensor image corresponding to the training input 602 (i.e., the particular image transformation corresponding to the nonreference MRI scanner that generated the diffusion tensor image). For example, in implementations in which the model outputs of the machine learning model 610 include a respective score for each image transformation in the predetermined set of image transformations, the ground-truth model output 604 can include a '1' for the score corresponding to the particular image transformation and a '0' for all other scores.

The parameter updating system 280 can determine an error between i) the predicted model output 612 and ii) the ground-truth model output 604. The training system 600 can use any appropriate classification loss function, e.g., categorical cross entropy loss or KL divergence. The training system 600 can then generate the parameter update 622 according to the determined error. For example, in implementations in which the machine learning model 610 includes a neural network, the parameter updating system 620 can update the parameters of the neural network using gradient descent and backpropagation. In some implementations, the parameter updating system 620 determines the parameter update 622 using the respective errors of a batch of multiple different training inputs 602.

The parameter updating system 620 can apply parameter updates 622 at each of multiple training steps until the training of the machine learning model 610 is complete. In some implementations, the training system 600 executes a predetermined number of training steps. In some other implementations, the training system 600 can determine to end training after a performance of the machine learning model 610 (e.g., as measured by prediction accuracy) exceeds a predetermined threshold. In some other implementations, the training system 600 can determine to end training after the improvement to the performance of the machine learning model 610 between training steps has dropped below a predetermined threshold.

After training the machine learning model 610, the machine learning model 610 can be deployed on a DTI harmonization system (e.g., the DTI harmonization system 200 depicted in FIG. 2) that is configured to harmonize diffusion tensor images. In some implementations, at inference time, the trained machine learning model 610 can receive model inputs corresponding to diffusion tensor images generated by nonreference MRI scanners that were not seen during training, i.e., that did not generate any of the diffusion tensor images corresponding to training inputs 602.

Figure 7:
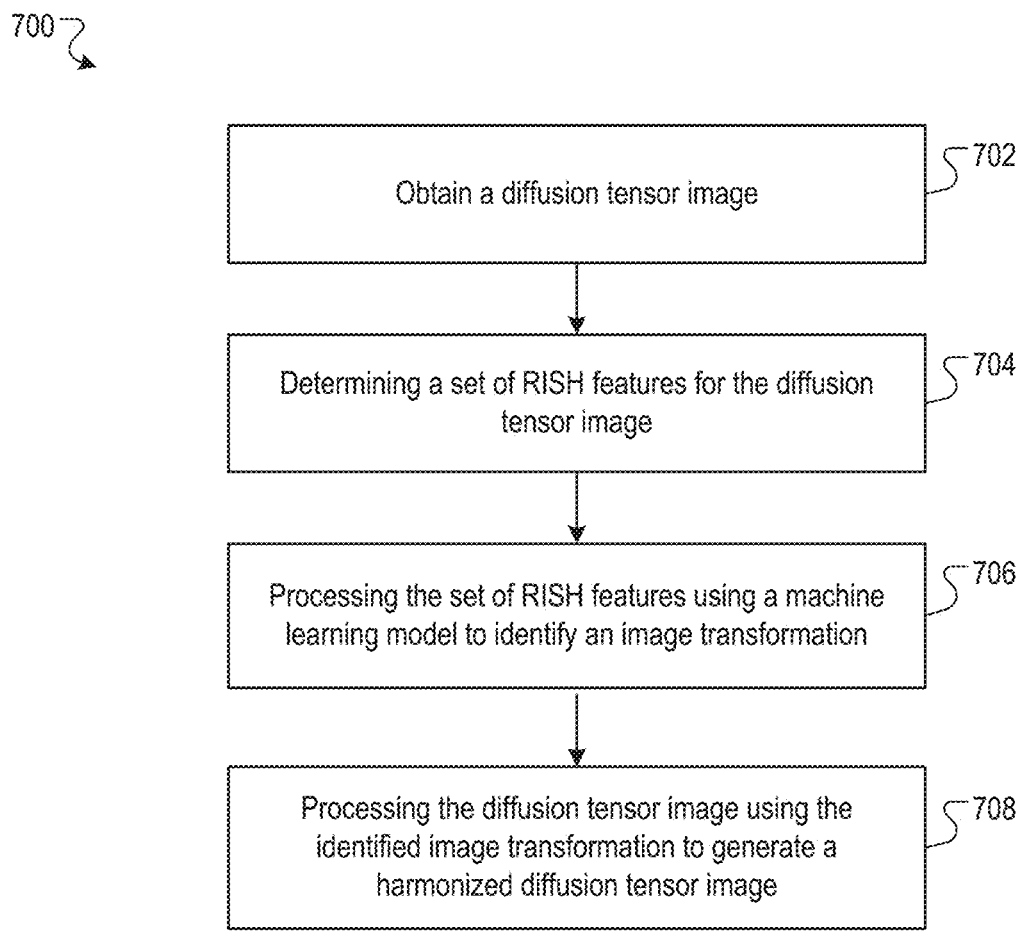
FIG. 7 is a flowchart of an example process for harmonizing a diffusion tensor image.

FIG. 7 is a flowchart of an example process 700 for harmonizing a diffusion tensor image. The process 700 can be implemented by one or more computer programs installed on one or more computers and programmed in accordance with this specification. For example, the process 700 can be performed by the computer server module depicted in FIG. 1A. For convenience, the process 700 will be described as being performed by a system of one or more computers.

The system obtains a diffusion tensor image that has been generated by a particular MRI scanner (step 702).

The system determines a set of RISH features for the diffusion tensor image (step 704).

The system processes the set of RISH features using a machine learning model to identify an image transformation (step 706). The machine learning model can be configured through training to process a model input that includes a set of RISH features corresponding to a diffusion tensor image and to generate a model output that identifies a particular image transformation from a set of image transformations. Each image transformation in the set of image transformations can correspond to a respective different first MRI scanner, and can represents a transformation that, when applied to first diffusion tensor images captured by the first MRI scanner, harmonizes the first diffusion tensor images with second diffusion tensor images captured by a reference MRI scanner.

The system processes the diffusion tensor image using the identified image transformation to generate a harmonized diffusion tensor image (step 708).

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory storage medium for execution by, or to control the operation of, data processing apparatus. The computer storage medium can be a machine-readable storage device, a machine-readable storage substrate, a random or serial access memory device, or a combination of one or more of them. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus.

The term "data processing apparatus" refers to data processing hardware and encompasses all kinds of apparatus, devices, and machines for processing data, including by way of example a programmable processor, a computer, or multiple processors or computers. The apparatus can also be, or further include, special purpose logic circuitry, e.g., an FPGA (field programmable gate array) or an ASIC (application-specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program which may also be referred to or described as a program, software, a software application, an app, a module, a software module, a script, or code) can be written in any form of programming language, including compiled or interpreted languages, or declarative or procedural languages, and it can be deployed in any form, including as a stand-alone program or as a module, component, subroutine, or other unit suitable for use in a computing environment. A program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a data communication network.

For a system of one or more computers to be configured to perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

As used in this specification, an "engine," or "software engine," refers to a software implemented input/output system that provides an output that is different from the input. An engine can be an encoded block of functionality, such as a library, a platform, a software development kit ("SDK"), or an object. Each engine can be implemented on any appropriate type of computing device, e.g., servers, mobile phones, tablet computers, notebook computers, music players, e-book readers, laptop or desktop computers, PDAs, smart phones, or other stationary or portable devices, that includes one or more processors and computer readable media. Additionally, two or more of the engines may be implemented on the same computing device, or on different computing devices.

The processes and logic flows described in this specification can be performed by one or more programmable computers executing one or more computer programs to perform functions by operating on input data and generating output. The processes and logic flows can also be performed by special purpose logic circuitry, e.g., an FPGA or an ASIC, or by a combination of special purpose logic circuitry and one or more programmed computers.

Computers suitable for the execution of a computer program can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. The central processing unit and the memory can be supplemented by, or incorporated in, special purpose logic circuitry. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and pointing device, e.g, a mouse, trackball, or a presence sensitive display or other surface by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's device in response to requests received from the web browser. Also, a computer can interact with a user by sending text messages or other forms of message to a personal device, e.g., a smartphone, running a messaging application, and receiving responsive messages from the user in return.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface, a web browser, or an app through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network (LAN) and a wide area network (WAN), e.g., the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data, e.g., an HTML page, to a user device, e.g., for purposes of displaying data to and receiving user input from a user interacting with the device, which acts as a client. Data generated at the user device, e.g., a result of the user interaction, can be received at the server from the device.

In addition to the embodiments described above, the following embodiments are also innovative:

Embodiment 1 is a method comprising:
  obtaining a diffusion tensor image that has been generated by a particular MRI scanner;
  determining a set of rotation invariant spherical harmonic (RISH) features for the diffusion tensor image;
  processing the set of RISH features using a machine learning model to identify an image transformation, wherein:
    the machine learning model has been configured through training to process a model input comprising a set of RISH features corresponding to a diffusion tensor image and to generate a model output that identifies a particular image transformation from a set of image transformations; and
    each image transformation in the set of image transformations corresponds to a respective different first MRI scanner and represents a transformation that, when applied to first diffusion tensor images captured by the first MRI scanner, harmonizes the first diffusion tensor images with second diffusion tensor images captured by a reference MRI scanner; and
  processing the diffusion tensor image using the identified image transformation to generate a harmonized diffusion tensor image.

Embodiment 2 is the method of embodiment 1, wherein the model output of the machine learning model comprises, for each image transformation in the set of image transformations, a value representing a degree to which the diffusion tensor image is similar to the first diffusion tensor images captured by the first MRI scanner corresponding to the image transformation.

Embodiment 3 is the method of any one of embodiments 1 or 2, further comprising generating the set of image transformations, comprising, for each first MRI scanner:
  obtaining a plurality of training diffusion tensor images captured by the first MRI scanner;
  determining, for each training diffusion tensor image, a respective set of training RISH features;
  determining a measure of central tendency of the sets of training RISH features; and
  generating the image transformation corresponding to the first MRI scanner using the determined measure of central tendency.

Embodiment 4 is the method of embodiment 3, further comprising:
  obtaining a plurality of new training images captured by a new MRI scanner;
  generating a new image transformation corresponding to the new MRI scanner; and
  re-training the machine learning model to generate model outputs that comprise a value corresponding to the new image transformation.

Embodiment 5 is the method of any one of embodiments 1-4, further comprising training the machine learning model, comprising:
  obtaining a training data set comprising a plurality of training examples, wherein each training example comprises i) a training model input corresponding to a training image and ii) a ground-truth model output that identifies an image transformation from the set of image transformations, wherein the ground-truth image transformation corresponds to either i) the MRI scanner that captured the training image or ii) an MRI scanner that is similar to the MRI scanner that captured the training image; and
  for each training model input:
    processing the training model input using the machine learning model to generate a predicted model output; and
    determining an error between (i) the predicted model output and (ii) the corresponding ground-truth model output; and
  generating a parameter update for the machine learning model using the determined errors.

Embodiment 6 is the method of embodiment 5, wherein the particular MRI scanner did not capture any training images in the training data set.

Embodiment 7 is the method of any one of embodiments 1-6, wherein the machine learning model is a convolutional neural network that processes the RISH features using a three-dimensional convolutional filter.

Embodiment 8 is a system comprising one or more computers and one or more storage devices storing instructions that are operable, when executed by the one or more computers, to cause the one or more computers to perform the method of any one of embodiments 1-7.

Embodiment 9 is a computer storage medium encoded with a computer program, the program comprising instructions that are operable, when executed by data processing apparatus, to cause the data processing apparatus to perform the method of any one of embodiments 1-7.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain some cases, multitasking and parallel processing may be advantageous.

What is claimed is:

1. A magnetic resonance imaging harmonization method comprising:
  maintaining, in a non-transitory memory, data representing a set of image transformations, wherein:
    each image transformation in the set of image transformations corresponds to a respective different set of magnetic resonance imaging (MRI) scanners, and
    each image transformation in the set of image transformations represents a transformation that, when applied to first diffusion tensor images generated by respective MRI scanners in the set of MRI scanners corresponding to the image transformation, harmonizes the first diffusion tensor images with second diffusion tensor images;
  receiving one or more diffusion tensor images generated by a particular MRI scanner that is not a member of any of the sets of MRI scanners corresponding to respective image transformations;
  determining, for each image transformation in the set of image transformations and using a DTI harmonization system, a measure of similarity between (i) the one or more diffusion tensor images generated by the particular MRI scanner and (ii) the first diffusion tensor images generated by respective MRI scanners in the set of MRI scanners corresponding to the image transformation;
  determining, based on the respective measures of similarity and using the DTI harmonization system, whether to generate a new image transformation corresponding to the particular MRI scanner; and
  in response to determining to generate a new image transformation corresponding to the particular MRI scanner:
    processing, using an image transformation generation system, (i) data representing the one or more diffusion tensor images generated by the particular MRI scanner and (ii) data representing the second diffusion tensor images to generate the new image transformation; and
    adding the new image transformation to the set of image transformations stored in the image transformation database.

2. A magnetic resonance imaging harmonization system comprising one or more computers and one or more storage devices storing instructions that are operable, when executed by the one or more computers, to cause the one or more computers to perform operations comprising:
  Maintaining, in non-transitory memory, data representing a set of image transformations, wherein:
    each image transformation in the set of image transformations corresponds to a respective different set of magnetic resonance imaging (MRI) scanners, and
    each image transformation in the set of image transformations represents a transformation that, when applied to first diffusion tensor images generated by respective MRI scanners in the set of MRI scanners corresponding to the image transformation, harmonizes the first diffusion tensor images with second diffusion tensor images;
  receiving one or more diffusion tensor images generated by a particular MRI scanner that is not a member of any of the sets of MRI scanners corresponding to respective image transformations;
  determining, for each image transformation in the set of image transformations and using a DTI harmonization system, a measure of similarity between (i) the one or more diffusion tensor images generated by the particular MRI scanner and (ii) the first diffusion tensor images generated by respective MRI scanners in the set of MRI scanners corresponding to the image transformation;
  determining, based on the respective measures of similarity and using the DTI harmonization system, whether to generate a new image transformation corresponding to the particular MRI scanner; and
  in response to determining to generate a new image transformation corresponding to the particular MRI scanner:
    processing, using an image transformation generation system, (i) data representing the one or more diffusion tensor images generated by the particular MRI scanner and (ii) data representing the second diffusion tensor images to generate the new image transformation; and
    adding the new image transformation to the set of image transformations stored in the image transformation database.

3. One or more non-transitory storage media storing magnetic resonance imaging harmonization instructions that when executed by one or more computers cause the one or more computers to perform operations comprising:
  Maintaining, in non-transitory memory, data representing a set of image transformations, wherein:
    each image transformation in the set of image transformations corresponds to a respective different set of magnetic resonance imaging (MRI) scanners, and
    each image transformation in the set of image transformations represents a transformation that, when applied to first diffusion tensor images generated by respective MRI scanners in the set of MRI scanners corresponding to the image transformation, harmonizes the first diffusion tensor images with second diffusion tensor images;
  receiving one or more diffusion tensor images generated by a particular MRI scanner that is not a member of any of the sets of MRI scanners corresponding to respective image transformations;
  determining, for each image transformation in the set of image transformations and using a DTI harmonization system, a measure of similarity between (i) the one or more diffusion tensor images generated by the particular MRI scanner and (ii) the first diffusion tensor images generated by respective MRI scanners in the set of MRI scanners corresponding to the image transformation;
  determining, based on the respective measures of similarity and using the DTI harmonization system, whether to generate a new image transformation corresponding to the particular MRI scanner; and
  in response to determining to generate a new image transformation corresponding to the particular MRI scanner:

processing, using an image transformation generation system (i) data representing the one or more diffusion tensor images generated by the particular MRI scanner and (ii) data representing the second diffusion tensor images to generate the new image transformation; and adding the new image transformation to the set of image transformations stored in the image transformation database.

4. The method of claim 1, further comprising, in response to determining not to generate a new image transformation corresponding to the particular MRI scanner:

identifying, from the set of image transformations, the image transformation whose corresponding measure of similarity indicates a highest similarity, among the image transformations in the set of image transformations, between (i) the one or more diffusion tensor images generated by the particular MRI scanner and (ii) the first diffusion tensor images generated by respective MRI scanners in the set of MRI scanners corresponding to the image transformation; and processing the one or more diffusion tensor images generated by the particular MRI scanner using the identified image transformation to generate respective harmonized diffusion tensor images.

5. The method of claim 1, wherein determining, for each image transformation in the set of image transformations, a respective measure of similarity comprises:

processing a model input generated from the one or more diffusion tensor images generated by the particular MRI scanner using a machine learning model to generate a model output that identifies, for each image transformation in the set of image transformations, the respective measure of similarity, wherein the machine learning model has been configured through training to process a model input generated from a diffusion tensor image and to generate a model output that includes a respective score for each image transformation in the set of image transformations.

6. The method of claim 5, further comprising, in response to determining to generate a new image transformation corresponding to the particular MRI scanner:

re-training the machine learning model to generate model outputs that comprise a score corresponding to the new image transformation.

7. The method of claim 1, wherein determining, for each image transformation in the set of image transformations, a respective measure of similarity comprises:

comparing (i) a set of one or more statistics representing the one or more diffusion tensor images generated by the particular MRI scanner and (ii) a set of one or more statistics representing the first diffusion tensor images generated by respective MRI scanners in the set of MRI scanners corresponding to the image transformation.

8. The method of claim 7, wherein the sets of statistics comprise one or more of:

a distribution of a number of tracts measured in the respective diffusion tensor images, an average number of tracts measured in the respective diffusion tensor images, a distribution of fractional anisotropy (FA) values of the respective diffusion tensor images, an average FA value of the respective diffusion tensor images, a distribution of modularity values of the respective diffusion tensor images, an average modularity value of the respective diffusion tensor images, a distribution of path lengths of the respective diffusion tensor images, an average path length of the respective diffusion tensor images, a distribution of global efficiency values of the respective diffusion tensor images, or an average global efficiency value of the respective diffusion tensor images.

9. The method of claim 7, wherein determining, based on the respective measures of similarity, whether to generate a new image transformation corresponding to the particular MRI scanner comprises:

determining that a difference between (i) the set of statistics representing the one or more diffusion tensor images generated by the particular MRI scanner and (ii) the set of statistics representing the first diffusion tensor images generated by respective MRI scanners in the set of MRI scanners corresponding to the image transformation satisfies a predetermined threshold.

10. The method of claim 1, wherein processing (i) data representing the one or more diffusion tensor images generated by the particular MRI scanner and (ii) data representing the second diffusion tensor images to generate the new image transformation comprises:

determining, for each of the one or more diffusion tensor images generated by the particular MRI scanner, a respective set of rotation invariant spherical harmonic (RISH) features for the diffusion tensor image;

determining a measure of central tendency of the sets of RISH features of the diffusion tensor images generated by the particular MRI scanner; and generating the new image transformation corresponding to the particular MRI scanner using (i) the measure of central tendency of the sets of RISH features of the diffusion tensor images generated by the particular MRI scanner and (ii) a set of RISH features representing the second diffusion tensor images.

11. The system of claim 2, further comprising, in response to determining not to generate a new image transformation corresponding to the particular MRI scanner:

identifying, from the set of image transformations, the image transformation whose corresponding measure of similarity indicates a highest similarity, among the image transformations in the set of image transformations, between (i) the one or more diffusion tensor images generated by the particular MRI scanner and (ii) the first diffusion tensor images generated by respective MRI scanners in the set of MRI scanners corresponding to the image transformation; and processing the one or more diffusion tensor images generated by the particular MRI scanner using the identified image transformation to generate respective harmonized diffusion tensor images.

12. The system of claim 2, wherein determining, for each image transformation in the set of image transformations, a respective measure of similarity comprises:

processing a model input generated from the one or more diffusion tensor images generated by the particular MRI scanner using a machine learning model to generate a model output that identifies, for each image transformation in the set of image transformations, the respective measure of similarity, wherein the machine learning model has been configured through training to process a model input generated from a diffusion tensor image and to generate a model output that includes a respective score for each image transformation in the set of image transformations.

13. The system of claim 12, further comprising, in response to determining to generate a new image transformation corresponding to the particular MRI scanner:
re-training the machine learning model to generate model outputs that comprise a score corresponding to the new image transformation.

14. The system of claim 2, wherein determining, for each image transformation in the set of image transformations, a respective measure of similarity comprises:
comparing (i) a set of one or more statistics representing the one or more diffusion tensor images generated by the particular MRI scanner and (ii) a set of one or more statistics representing the first diffusion tensor images generated by respective MRI scanners in the set of MRI scanners corresponding to the image transformation.

15. The system of claim 14, wherein determining, based on the respective measures of similarity, whether to generate a new image transformation corresponding to the particular MRI scanner comprises:
determining that a difference between (i) the set of statistics representing the one or more diffusion tensor images generated by the particular MRI scanner and (ii) the set of statistics representing the first diffusion tensor images generated by respective MRI scanners in the set of MRI scanners corresponding to the image transformation satisfies a predetermined threshold.

16. The non-transitory storage media of claim 3, further comprising, in response to determining not to generate a new image transformation corresponding to the particular MRI scanner:
identifying, from the set of image transformations, the image transformation whose corresponding measure of similarity indicates a highest similarity, among the image transformations in the set of image transformations, between (i) the one or more diffusion tensor images generated by the particular MRI scanner and (ii) the first diffusion tensor images generated by respective MRI scanners in the set of MRI scanners corresponding to the image transformation; and
processing the one or more diffusion tensor images generated by the particular MRI scanner using the identified image transformation to generate respective harmonized diffusion tensor images.

17. The non-transitory storage media of claim 3, wherein determining, for each image transformation in the set of image transformations, a respective measure of similarity comprises:
processing a model input generated from the one or more diffusion tensor images generated by the particular MRI scanner using a machine learning model to generate a model output that identifies, for each image transformation in the set of image transformations, the respective measure of similarity,
wherein the machine learning model has been configured through training to process a model input generated from a diffusion tensor image and to generate a model output that includes a respective score for each image transformation in the set of image transformations.

18. The non-transitory storage media of claim 17, further comprising, in response to determining to generate a new image transformation corresponding to the particular MRI scanner:
re-training the machine learning model to generate model outputs that comprise a score corresponding to the new image transformation.

19. The non-transitory storage media of claim 3, wherein determining, for each image transformation in the set of image transformations, a respective measure of similarity comprises:
comparing (i) a set of one or more statistics representing the one or more diffusion tensor images generated by the particular MRI scanner and (ii) a set of one or more statistics representing the first diffusion tensor images generated by respective MRI scanners in the set of MRI scanners corresponding to the image transformation.

20. The non-transitory storage media of claim 19, wherein determining, based on the respective measures of similarity, whether to generate a new image transformation corresponding to the particular MRI scanner comprises:
determining that a difference between (i) the set of statistics representing the one or more diffusion tensor images generated by the particular MRI scanner and (ii) the set of statistics representing the first diffusion tensor images generated by respective MRI scanners in the set of MRI scanners corresponding to the image transformation satisfies a predetermined threshold.

* * * * *